(12) United States Patent
Chilton, III et al.

(10) Patent No.: US 6,362,425 B1
(45) Date of Patent: Mar. 26, 2002

(54) GROUNDING STRUCTURE FOR USE BETWEEN SURFACES OF ALIGNED EQUIPMENT HOUSING ELEMENTS

(75) Inventors: Robert Chilton, III, Abington; Brent Lee Patterson, Conshohocken; William H. Segarra, Linwood; George Hubbard, Collingdale, all of PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/618,434

(22) Filed: Jul. 18, 2000

(51) Int. Cl.⁷ .................................................. H05K 5/02
(52) U.S. Cl. ...................... 174/51; 174/40 CC; 439/98; 439/100; 29/854
(58) Field of Search .......................... 174/6, 51, 40 CC, 174/135, 53, 35 R, 78, 2, 55 G; 439/98, 100, 95; 361/799, 753, 212, 683; 29/854, 857, 866, 747; 343/846

(56) References Cited

U.S. PATENT DOCUMENTS

| 5,442,133 | A | * | 8/1995 | Arnold et al. | ................. | 174/51 |
| 6,011,218 | A | * | 1/2000 | Burek et al. | ............. | 174/40 CC |
| 6,186,800 | B1 | * | 2/2001 | Klein et al. | ..................... | 439/95 |
| 6,188,020 | B1 | * | 2/2001 | Osterbrock et al. | ........... | 174/51 |

FOREIGN PATENT DOCUMENTS

GB 2194860 * 3/1988 ................. 174/51

JP 406006065 * 1/1994 .................. 174/51

* cited by examiner

*Primary Examiner*—Dean A. Reichard
*Assistant Examiner*—Dhiru R Patel
(74) *Attorney, Agent, or Firm*—Mayer Fortkort & Williams, PC; Karin L. Williams, Esq

(57) ABSTRACT

A housing for electronic circuits designed, illustratively, for use in cable television networks includes a specialized electrically conductive grounding clip that establishes grounding contact between an exterior surface of a first housing element and an interior surface of a second housing element, the first housing element being positionable within an opening in the second housing element such that the interior and exterior surfaces are substantially aligned. The grounding deice includes an intermediate section defining a first end and a second end and a through opening, with an arcuate spring biased grounding clip extending along the through opening. First and second integral flange sections extend from the first and second ends of the intermediate section, respectively, and are dimensioned and arranged to apply retention forces, to substantially opposing surfaces of one of the housing elements so that the ground clip is held in place without the need for a mechanical fastener or adhesive. This allows, for example, the first housing element to be simply and easily inserted into the second housing element and later secured thereto with a repeatable and reliable grounding that does not rely upon the skill of the factory assembler or field maintenance personnel.

19 Claims, 3 Drawing Sheets

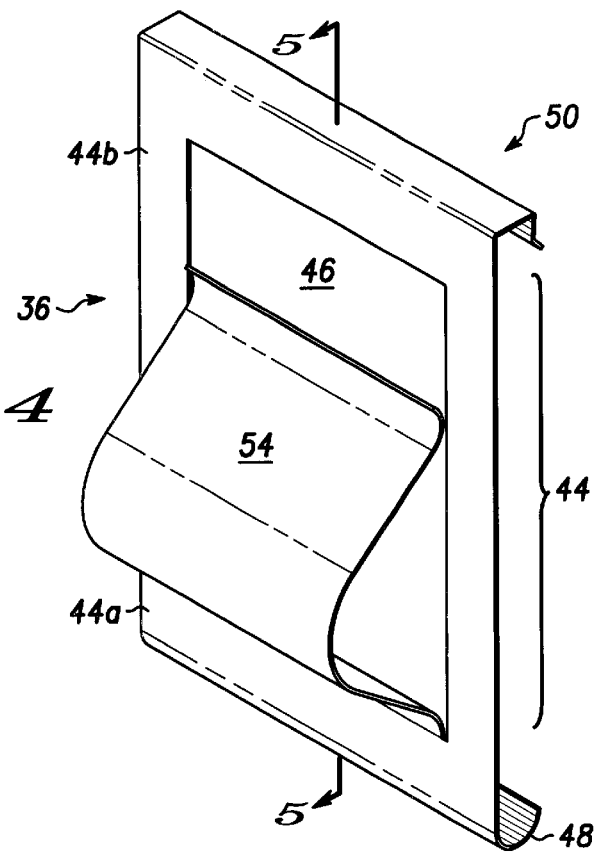
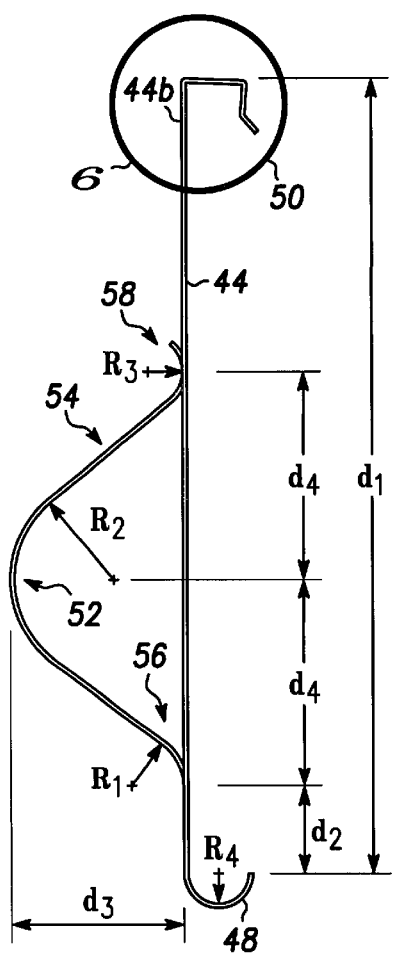
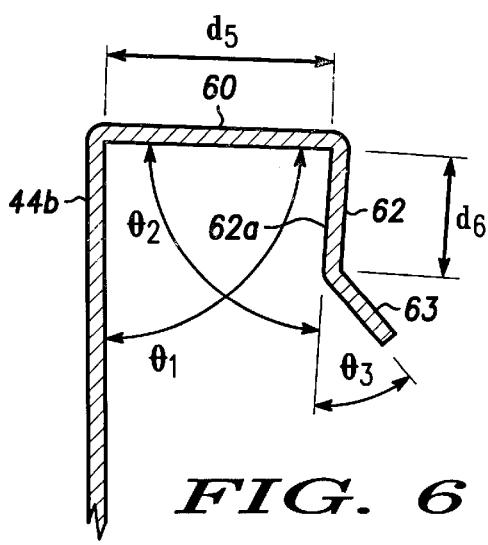

GROUNDING STRUCTURE FOR USE BETWEEN SURFACES OF ALIGNED EQUIPMENT HOUSING ELEMENTS

FIELD OF THE INVENTION

The preset invention relates generally to the packaging of electronic equipment, and more particularly, to the reliable grounding of electronic components mounted within a housing.

BACKGROUND OF THE INVENTION

An illustrative application in which the grounding structure and technique of the present invention is especially useful is in the packaging of certain cable television (CATV) equipment. Conventional broadband coaxial CATV systems, for example, have typically been designed with a system architecture known as "trunk and feeder". The function of a trunk coaxial cable is to deliver broadband television signals from a reception center, or headend, over the shortest distance with the least amount of amplification to a plurality of distribution points. The distribution points en are connected to feeder coaxial cables which emanate from the trunk coaxial cable and contain subscriber tap off devices. At the distribution points, the feeders connect to the trunk at locations commonly termed trunk/ridger stations. Each trunk/bridger station generally includes a trunk amplifier for maintaining sufficient signal level through the trunk coaxial cable and a bridger amplifier for tapping off a portion of the trunk signal and distributing it to the feeders emanating from the trunk/bridger station. Because they are at the same location, the trunk amplifier and bridger amplifier have generally been contained within the same environmental housing.

In the course of routine maintenance as well as to perform emergency repairs, it is occasionally necessary to remove the aforementioned amplifier equipment from its housing and install a replacement. Because a large number of subscribers may potentially be affected by such an operation, and because of the substantial quantity of these devices in the typical CATV network, it is highly desirable that the replacement be performed quickly and efficiently. For this reason, a need exists for an amplifier and signal splitting package that is configured as a single, integral assembly. A further need exists for a reliable grounding technique by which adequate and repeatable grounding connections may be made between such a package and the housing in which it is mounted.

SUMMARY OF THE INVENTION

The aforementioned need is addressed, and an advance is made in the art, by a grounding device for use in establishing grounding contact between an electrically conductive surface of a first housing element and an electrically conductive surface of a second housing element, the first housing element being positionable within an opening in the second housing element such that the respective electrically conductive surfaces of each housing element are substantially aligned. In accordance with an illustrative embodiment of the present invention, the electrically conductive surfaces face one another and the grounding device is interposed therebetween.

A grounding device constructed in accordance with an illustrative embodiment of the invention comprises an intermediate section defining a first end and a second end and a through opening. First and second integral flange sections extend from the first and second ends of the intermediate section, respectively, and these flange sections are dimensioned and arranged to apply retention forces to substantially opposing surfaces of one of the first and second housing elements. By way of illustration, the opposing surfaces may be defined on the first housing element such that they are contiguous with the electrically conductive surface thereof. Such an arrangement maintains alignment of the intermediate section with the electrically conductive surface of the first housing element, such that the first housing element may be readily inserted into the second housing element without the risk of the grounding device becoming dislodged, loosened, or improperly positioned and without the need for mechanical fasteners or electrically conductive adhesives. An arcuate spring clip section extends along the through opening, the spring clip section being free to flex and being dimensioned and arranged to provide grounding contact with the electrically conductive of the second housing element when the first housing element is disposed within the opening of the second housing element.

A modular electronics package constructed in accordance with an illustrative embodiment of the present invention comprises, in combination, an electronics module comprising a first housing element positionable with an opening in a housing such that an electrically conductive exterior surface of the first housing element faces is aligned with an electrically conductive interior surface of the second housing element. The electronics package further includes a printed circuit board electrically coupled to the first housing element, the printed circuit board having at least one electronic component disposed thereon adapted to operate only when the electrically conductive exterior surface of the first housing element is properly connected to ground.

The illustrative modular electronics package further includes at least one grounding device electrically coupled and secured to the first housing element without the use of mechanical fasteners or adhesives. By way of illustration, the grounding device may be configured with an intermediate section defining a first end and a second end and a through opening, with first and second integral flange sections extending from the first and second ends of the intermediate section. To retain the intermediate section in position with respect to the electrically conductive surface of the first housing element, the first and second integral flange sections are dimensioned and arranged to apply retention forces to substantially opposing surfaces of the first electrically conductive housing element. An arcuate spring clip section extends along the through opening of the intermediate section, the spring clip section being free to flex and being dimensioned and arranged to provide grounding contact with the electrically conductive interior surface of the second housing element. Depending upon the specific design requirements of a given application, a plurality of grounding elements may be employed so as to establish respective grounding paths between mutually aligned surfaces of the first housing element and second housing element.

As will be readily ascertained by those skilled in the art, an installed modular electronics package constructed in accordance with the present invention may be easily installed and easily removed from a second housing element - during factory assembly and testing operations, for example—and a replacement rapidly inserted in its place in the field without the risk of unpredictable or unrepeatable grounding behavior.

BRIEF DESCRIPTION OF THE DRAWINGS

The various features and advantages of the subject invention will be better understood by reference to the detailed description which follows taken in conjunction with the accompanying drawings, of which:

FIG. 4 is an isometric view of a single grounding device constructed in accordance with an illustrative embodiment of the present invention;

FIG. 5 is a cross sectional view of the grounding device of FIG. 4, taken across line IV—IV in FIG. 4; and FIG. 6 is an exploded view of the encircled region B in FIG. 5.

DETAILED DESCRIPTION OF THE INVENTION

Figure 1:
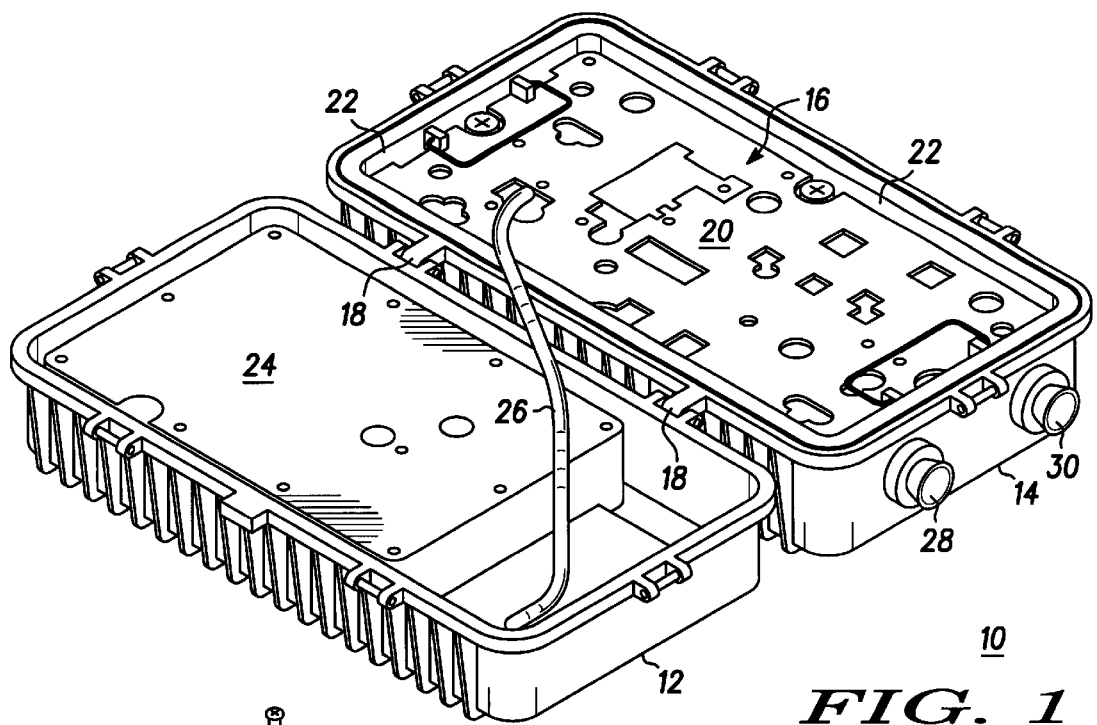
FIG. 1 is an isometric view of a complete assembly incorporating a package constructed in accordance with the teachings of the present invention; the cover being opened to reveal an upper surface of the package.

With initial reference to FIG. 1, there is shown a representative example of a completed assembly 10 that incorporates a modular electronics package constructed in accordance with the present invention. In the embodiment shown, cover 12 and chassis with housing element 14 (a "second housing element") collectively form a clamshell housing, with access to the interior compartment housing electronics package 16 being obtained by pivoting the hinged cover 12 about hinges 18 in the manner shown. By way of non-limiting example, the completed assembly 10 may be configured as a trunk/bridger station of a cable television network (CATV). Such stations typically include a trunk amplifier (not shown) for maintaining a sufficient signal level through a trunk coaxial cable and a bridger amplifier for tapping off a portion of the trunk signal and distributing it to the feeders emanating from the trunk/bridger station.

Of course, as will soon become apparent, the grounding technique and structure of the present invention may be employed in any application where there is a need to provide a reliable ground path between opposing or otherwise aligned, electrically conductive surfaces which are movable relative to one another during assembly. Thus, although the grounding device of the present invention will be described in detail with respect to the particular illustrative environment of a CATV trunk/bridging station, it should be emphasized that such description is for purposes of non-limiting example only.

In any event, and with continued reference to the illustrative example FIG. 1, it will be seen that housing element 14 defines an interior compartment having an opening dimensioned and arranged to receive the electronics module 16, the only visible portion of the latter being a radio frequency (RF) shield 20 designed to protect sensitive electronic components within the compartment. Within the compartment is a substantially planar interior surface 22 (a "fourth electrically conductive surface") which extends along the entire perimeter of the compartment. For a variety of reasons, including the need for durability and the dissipation of heat, cover 12 and housing element 14 are typically constructed of an electrically conductive metal or alloy such, for example, as aluminum, As such, in the illustrative example of FIG. 1 the entire peripheral surface 22 is electrically conductive such that a grounding connection made in accordance with the present invention may be made at any selected location along the perimeter of the modul-ereceiving compartment. Should it not be necessary or desirable to fabricate the entirety of housing element 14 from an electrically conductive material, however, it Will suffice to provide localized regions of electrically conductive material to define electrically conductive, grounding contact surfaces.

Continuing with the illustrative trunk/bridger amplifier embodiment of a completed assembly depicted in FIG. 1, it will be seen that additional components or circuitry, generally indicated at reference numeral 24, may be retained within a second compartment defined in cover 12. Electrical interconnectivity between electronics module 16 and additional components 24 is achieved by an appropriate multiple conductor cable as cable 26. Several output ports (only two of which, generally indicated at reference numerals 28 and 30,are shown) and an RF input port (not shown, opposite port 30) are defined in housing element 14 to accommodate appropriate connection to a CATV network. To permit removal and replacement of electronics module 16 without disturbing the external RF connections, the RF ports as ports 28 and 30 may be coupled to the electronics module by appropriate two-piece, right angle connectors (not shown) within the compartment of housing element 14.

Figure 2:
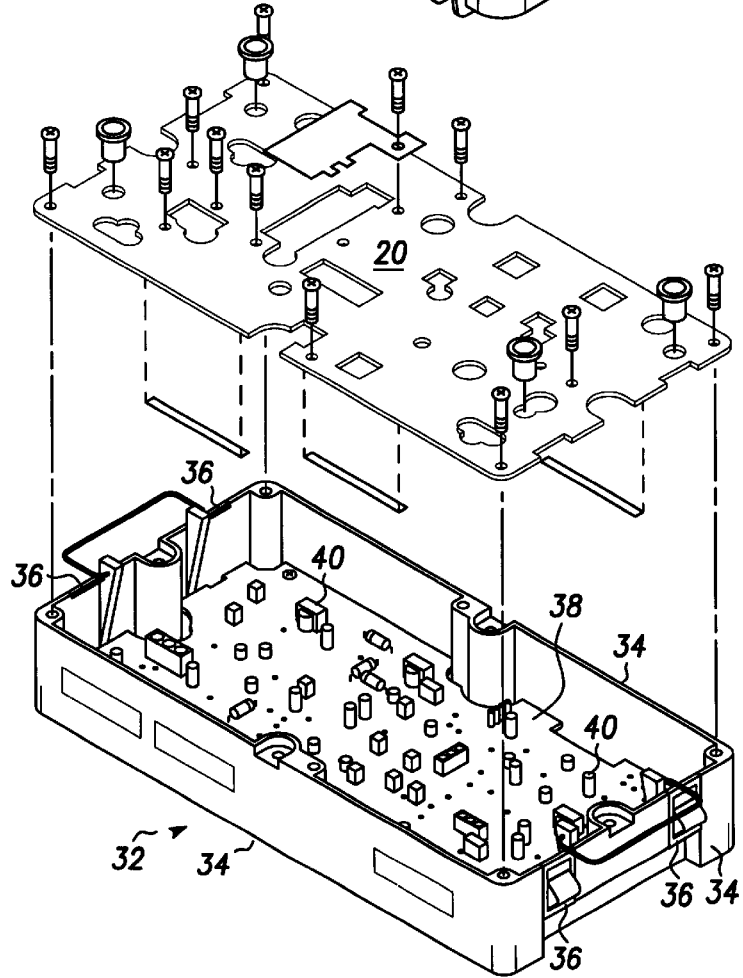
FIG. 2 is a partially exploded view of the illustrative package of FIG. 1 depicting the arrangement of multiple grounding devices in accordance with the teachings of the present invention.

Referring now to FIG. 2, electronics module 16 is shown in greater detail with RF shield 20 removed to reveal the internal construction. In the illustrative embodiment, electronics module 16 comprises a housing element 32 (a "first housing element") comprised of an electrically conductive material and dimensioned to be received within the compartment of housing element 14 (the "second housing element" discussed above). To this end, housing element 32 defines an electrically conductive peripheral exterior surface 34 (a "second electrically conductive surface") which corresponds to and is alignable with the electrically conductive, interior surface 22 (the "fourth electrically conductive surface") of housing element 14. Accordingly, where as in the case of the embodiment of FIG. 1 the interior surface 22 of housing is substantially planar and oriented in a substantially vertical plane, likewise the exterior surface 34 is also substantially planar and oriented in a substantially vertical plane such that a mating registration with a suitable amount of clearance between mutually opposing surfaces 22 and 34 Is achieved. As will be explained in more detail later, this arrangement permits one or more grounding devices 36 to be secured to a first of the housing elements 12 and 32 at any selected location along a corresponding one of the interior and exterior surfaces 22 and 34, respectively.

In the exemplary embodiment of FIG. 2, it will be seen that the grounding devices 36 are positioned on housing element 32 so as to overly selected portions of exterior surface 34. As was mentioned earlier with respect to housing element 14, housing element 32 need not be configured as a monolithic structure fabricated from an electrically conductive material. Rather, it is merely necessary to provide contact surface portions that are aligned with electrically conductive portions of surface 22, when the electronics module 16 is inserted into housing element 14, such that a grounding device interposed between these electrically conductive portions acts as an electrically conductive bridge to provide a ground path between them. In any event, and with continued reference to FIG. 2, it will be seen that housing element 32 defines an interior recess dimensioned and arranged to receive a printed circuit board 38 electrically coupled to housing element 32. The precise configuration and arrangement of electronic components as components 40 on printed circuit board 38 is not deemed to be an inventive aspect of the present invention and, accordingly, a detailed discussion of the same has been omitted for clarity.

Figure 3:
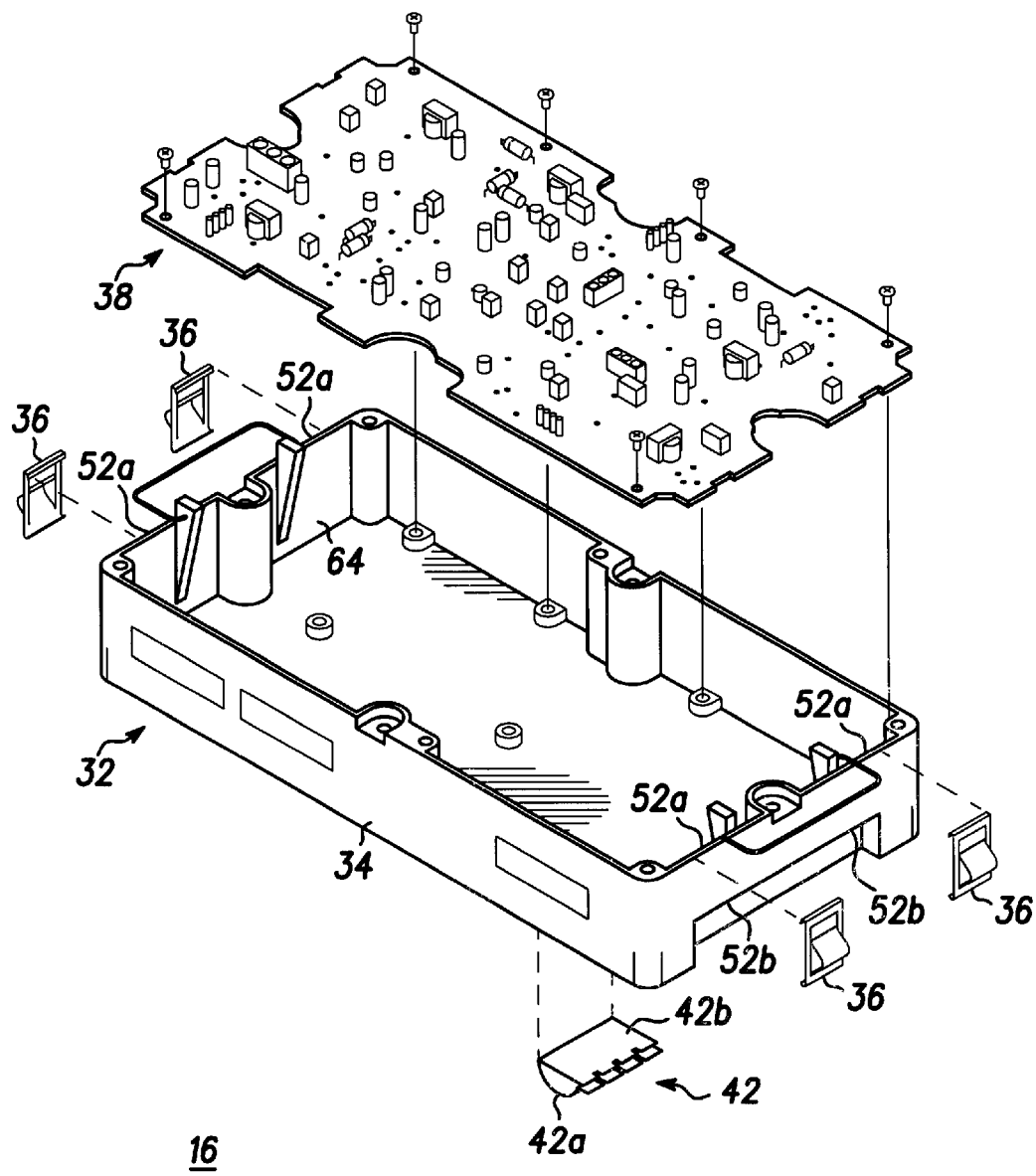
FIG. 3 is a further exploded view of the illustrative package of FIGS. 1 and 2, with greater detail of the grounding devices being visible.

Turning now to FIG. 3, there is shown an exploded view of electronics module 16 depicting in greater detail the manner in which several grounding devices 36 constructed in accordance with an exemplary embodiment of the present invention may be arranged at appropriate locations along the exterior surface 34 of housing element 32. Additional grounding contact between a bottom surface of housing element 32 and an upwardly facing compartment surface (not shown) of housing element 14 may also be provided by one or more conventional spring ground clips as ground clip 42. Essentially, ground clip 42 includes a spring clip portion 42a engageable with the surface of housing element 14 and a bonding surface portion 42b which must be adhesively bonded by a suitable electrically conductive epoxy and/or a mechanical fastener. While a conventional ground clip, as clip 42, is properly suited for establishing a ground path between electrically conductive surfaces disposed in mutually opposed, horizontal planes, it is not suited for the locations occupied by the inventive grounding device 36. Specifically, because ground clip 42 is designed to be bonded by an electrically conductive adhesive applied to surface 42b or by a mechanical fastener, it is both a labor intensive structure to install and prone to displacement and misalignment during factory testing and subsequent assembly operations. In the case of field repairs, where electronics modules such as module 16 may be stored for prolonged periods (during which they may be subjected to alternating cycles of high and low temperature as well as jarring motions and the like), the likelihood of misalignment due to poor adhesion is even greater.

Accordingly, it is a principal objective of the present invention to provide a grounding device which is not subject to the same disadvantages as ground clip 42, when it is to be interposed between mutually opposing, substantially vertical surfaces that are relatively movable, during initial assembly as well as field replacement. With reference now to FIG. 4, then it will be seen that in accordance with an illustrative embodiment of the present invention, a grounding device 36 constructed in accordance with the present invention is formed from an electrically conductive metal or metal alloy and includes an intermediate section 44 defining a first end 44a, a second end 44b, and a through opening 46.

The grounding device further includes first and second integral flange sections, generally indicated at 48 and 50, respectively, which extend from corresponding ends 44a and 44b of intermediate section 44. First and second integral flange sections 48, and 50, as well as the portion of intermediate section surrounding through opening 46, are dimensioned to provide a sufficient area of grounding contact with a surface of one of housing elements 12 and 32 to satisfy the electrical requirements of the given application. In the illustrative embodiment of the present invention depicted in FIGS. 1–6, first and second flange sections 48 and 50, are dimensioned and arranged to engage with opposing surfaces, indicated generally at 52a and 52b (FIG. 3) ("first and third electrically conductive surfaces", respectively) of housing element 32, these surfaces being contiguous with exterior surface 34 (the "second electrically conductive surface") such that the portion of intermediate section surrounding through opening 46 overlies and is adapted to make electrical contact with exterior surface 34 FIG. 2). Advantageously, first and second flange sections 48 and 50 apply retention forces to surfaces 52a and 52b to thereby maintain intermediate section 44 in alignment with housing element surface 34. As such, an electronics module as module 16 (FIGS. 1–3) incorporating one or more grounding devices according to the present invention may by handled during assembly, as web as stored without carefully controlling the ambient environmental conditions, without the substantial risk of ground clip misalignment associated with prior art designs.

Grounding contact with the other of the two opposing surfaces of housing elements 12 and 32 (interior surface 22 of housing element 14 in the illustrative example of FIGS. 1–3) is achieved by an arcuate spring clip section 54 which extends along through opening 46. To this end, spring clip section 54 is free to flex and is sufficiently stiff and resilient to contact surface 22 over a sufficiently wide area and with a sufficient amount of force to satisfy the grounding requirements of the specific application. As noted previously, grounding device 36 is constructed of an electrically conductive metal or metal alloy. Electrically conductive materials which are especially preferred for this purpose are alloys of beryllium copper, an alloy of copper known not only for its properties as an excellent thermal and electrical conductor, but also for its high fatigue strength and formability—it being understood that contact resistance depends on surface material and force, not size.

By way of illustrative example, grounding devices according to the present invention have been constructed from heat treatable 25 Alloy BeCu, an alloy of beryllium copper available from Instrument Specialties of Delaware Water Gap, Pennsylvania. Excellent results were achieved with BeCu 25 in a sheet thickness of 0.007", with grounding devices according to the present invention being formed by a conventional stamping process, followed by half-hardening. Advantageously, mill hardened beryllium copper is more formable than other mill hardened copper alloys of comparable strength, because most of its strength comes from precipitation hardening, not from cold working. Of course, as will be readily appreciated by those skilled in the art, a variety of other materials may be used in the fabrication of grounding devices according to the present invention. Examples of materials which may be suitable depending upon the amount of available contact area, and clearance between contact surfaces, include phosphor bronze (e.g., C521, H temper) and full or ¾ hardened stainless steel.

Depending upon the materials used in the construction of the electrical surfaces in contact with grounding device 36, it may be necessary to address to protect against galvanic corrosion. In the illustrative example of the structure depicted in FIGS. 1–3, for example, housing elements 12 and 32 are fabricated from cast aluminum. Protection against galvanic corrosion where grounding devices 36 are fabricated from beryllium copper may be achieved, for example, by a 0.0002" copper flash followed by a 0.0001"/ 0.0003" bright acid tin plate treatment. Of course, the necessity for and selection of the precise surface treatment used will ultimately depend upon the specific materials used in the construction of the respective components involved and it is deemed to be within the level of skill of the ordinary artisan to make suitable choices for the particular application.

Turning now to FIG. 5, which is a cross sectional view of the structure depicted in FIG. 4, specific details regarding the construction of grounding device 36 can be better seen. The length of intermediate section 44 is indicated generally at $d_1$ and in all the illustrative example depicted in FIG. 5, $d_1$ is on the order of about 1.130", with this distance corresponding to the height of that portion of surface 34

(FIGS. 2 and 3) with which intermediate section 44 will make electrical contact. As such, it will be understood that this dimension will vary in accordance with the amount of surface area available on the target mounting surface. It should also be noted that although each of surfaces 22 and 34 are depicted as being substantially planar throughout the several views, this need not be the case so long as they are adapted for mating registration (with the required amount of clearance) and so long as intermediate section 44 is likewise contoured so as to be capable of being positioned between them.

In any event, and with continued reference to FIG. 5, it will be seen that arcuate section 54 projects from intermediate section 44 beginning along an edge located a distance of $d_2$ (0.125" in the illustrative example) from end 44a. From an initial bend 56 having, in the exemplary embodiment, a radius of curvature $R_2$ of 0.078", arcuate section 54 extends in a direction away from intermediate section 44 for a distance of $d_3$, illustratively 0.25", whereupon arcuate section 54 bends back toward intermediate section 44 at a bend 57 having a radius of curvature $R_1$ of, say, 0.156". In the illustrative embodiment of FIG. 5, bend 57 bisects arcuate section 54 into two segments each traversing a distance of $d_4$, 0.30" in the illustrated embodiment, with respect to through opening 46. The terminal segment of arcuate section 54 has a final bend 58 with a radius of curvature R3 of say, 0.050'.

As will be readily appreciated by those skilled in the art, it is the exterior surface of bend 57 which makes primary contact with the electrically conductive surface of a target housing element. In the arrangement depicted in FIGS. 1–3, bend 57 makes contact with interior surface 22 of housing element 14. The precise area of electrical contact made with surface 22 is, of course, dependent upon such factors as the radius of curvature R2, as well as the clearance between interior surface 22 and exterior surface 34. Substantial flattening of arcuate element 54 occurs, for example, as housing element 32 is inserted into the compartment defined by housing element 14. It is the degree of this flattening, and the force at which bend 57 is forced into contact with the electrically conductive surface of housing element 14, which ultimately determines the contact resistance of the connection. Bend 58 facilitates this flattening by allowing the terminal tip of arcuate section 54 to ride within through opening 46 and along opposing housing element surface 22. Once housing element 32 comes into the final position suggested in FIG. 1, arcuate section 54 reaches a final position of deflection which, together with the surface area of intermediate section 44 in contact with surface 34, partially determines the electrical resistance of the ground connection. The remaining portion of the electrical resistance is determined by the degree and force of contact between first and second flange sections, 48 and 50, and opposing surfaces 52a and 52b of housing element 32 (FIG. 3).

With continued reference to FIG. 5, one possible construction of first flange section 48 will now be described in detail. As seen in FIG. 5, first flange section 48 extends inwardly along the lower transverse edge of the end 44a of intermediate section 44 and has a continuous bend having a radius of curvature $R_4$. The precise dimension of $R_4$ will, necessarily depend upon the dimension of the corresponding surface 52b of housing element 34. In the illustrative embodiment of FIG. 5, a radius of curvature of 0.050" was employed to correspond with a downwardly facing peripheral lip (not shown) of housing element 32 that defines surface 52b and that is contiguous with the lower edge of surface 34. Such an arrangement allows the grounding device of the present invention to be positioned on the exterior surface 34 of housing element 32 by placing first flange section 48 over curved surface 52b, pivoting the grounding device such that intermediate section 44 is substantially aligned with and overlies exterior surface 34, and bringing second flange section 50 into tight fitting engagement with surface 52a.

It should be emphasized that first section 48 need not be configured with a curved surface, and that any appropriate contour may be employed so long as it is adapted to permit manipulation of the device as a whole so that both flange sections may be brought into close fitting registration with opposing surfaces 52a and 52b of housing element 32.

Turning now to FIG. 6, an exemplary construction of a resilient second flange section 50 constructed in accordance with the present invention will now be described in detail. As seen in FIG. 6, second flange section 50 essentially has an L-shaped configuration, with a first leg 60 extending inwardly across the upper transverse edge of the end 44b of intermediate section 44. As such, the lower surface of leg 60 is adapted to face the upper surface of curved flange section 48 and engage mutually opposing surfaces 52b and 52a, respectively, of housing element 32. In order to retain grounding device 36 in one of the positions shown in FIG. 2, a second leg 62 depends downwardly from the terminal transverse edge of leg 60. Essentially, the back surface 62a of leg 62 is dimensioned and arranged to contact interior surface portions of housing element 32 contiguous with surfaces 52a, as interior surface portion 64 shown in FIG. 3. To allow the second flange section to be manipulated into such a position, an upwardly bent terminal lip 63 extends along the transverse terminal edge of leg 62. In accordance with the embodiment depicted in FIG. 4 and 5, first leg 60 has a length $d_5$ of 0.095" and forms an angle $\theta_1$ of 88° with intermediate section 44, and an angle $\theta_2$ of 92° with second leg 62, which has a length $d_6$ of 0.048". Terminal lip 63 extends a distance of $d_7$, which is approximately 0.030" in the illustrative embodiment, from the transverse edge of second leg 62 and forms an angle of 180°–$\theta_3$, which is 135° in the illustrative embodiment. By pressing on end region 44b of intermediate section 44, second flange section 50 can be quickly and easily snap fit into position over the electrically conductive area 52a of housing element 32. If desired, both of flange sections 48 and 50 may be designed using the configuration detail shown in FIG. 6, it being understood that the principal object of the flange sections is to apply retention forces to mutually opposing surfaces, as surfaces 52a and 52b, of the target mounting structure.

It should be emphasized that various modifications may be made to grounding device 36, depending upon such parameters as the surface contours of electrically conductive target surfaces 22 and 34, as well as the precise amount of electrical resistance required by the connection. Moreover, as suggested by FIGS. 2 and 3, any desired number of grounding devices may be used, the specific number and placement being dependent solely upon the available surface area defined by the interface of the respective electrically conductive surfaces. In any event, having described certain illustrative embodiments of the present invention in connection with an exemplary field of use, it will occur to those skilled in the art that modification and alternatives can be practiced without departing from the spirit and scope of the invention, which is to be limited only by the appended claims.

What is claimed is:

1. In combination with a first housing element defining first, second, and third electrically conductive surfaces, said first and third surfaces each having an edge portion contiguous with edge portions of said second surface, and a second housing element defining a fourth electrically conductive surface and an opening dimensioned and arranged to receive said first housing element with said second surface being aligned with said fourth surface, a grounding device having
an intermediate section defining a first end and a second end and a through opening,
first and second integral flange sections extending from the first and second ends of said intermediate section, respectively, and being dimensioned and arranged to establish grounding contact with and apply retention forces to the first and third surfaces of said first housing element to thereby maintain said intermediate section in alignment with the second surface, and
an arcuate spring clip section extending along the through opening said spring clip section being free to flax and being dimensioned and arranged to provide grounding contact with said fourth surface when said first housing element is disposed within the opening of said second housing element.

2. The combination of claim 1, wherein said grounding device is fabricated from a material selected from the group consisting of electrically conductive metals and alloys thereof.

3. The combination of claim 2, wherein said grounding device is fabricated from an alloy of beryllium copper.

4. The combination of claim 1, wherein said first and second housing elements are fabricated from the group consisting of electrically conductive metals and alloys thereof.

5. The combination of claim 1, wherein said first flange section has a substantially arcuate curvature having a radius of curvature dimensioned and arranged for mating engagement with a curved portion of the first surface.

6. The combination of claim 5, wherein said second flange section includes a resilient closure portion having a substantially L-shaped cross section dimensioned and arranged for mating engagement with a substantially planar portion of the third surface, and a terminal lip portion contiguous therewith, whereby said grounding device may be positioned on said first electrically conductive housing element by placing the first flange section over the curved portion of the first surface, pivoting said grounding device such that the intermediate section is substantially aligned with the second surface, manipulating said terminal lip portion such that said closure portion is brought into tight fitting engagement with said substantially planar portion of the third surface, and releasing said terminal lip portion.

7. The combination of claim 1, wherein at least one of said first and said second flange section includes a resilient closure portion having a substantially L-shaped cross section dimensioned and arranged for mating engagement with a substantially planar portion of the third surface, and a terminal lip portion contiguous therewith.

8. The combination of claim 1, further including a printed circuit board electrically coupled to said first electrically conductive housing element, said printed circuit board having at least one electronic component disposed thereon adapted to be operable while positioned within said second housing element.

9. The combination of claim 8, further including a cover dimensioned and arranged for mounting over the opening defined in said second housing element to thereby cover and completely enclose said printed circuit board.

10. The combination of claim 1, further including a cover dimensioned and arranged for mounting over the opening defined in said second housing element to thereby cover and completely enclose said first housing element.

11. A grounding device for use in establishing grounding contact between an exterior surface of a first housing element and an interior surface of a second housing element, the first housing element being positionable with an opening in said second housing element such that said interior and exterior surfaces are in substantial alignment, said grounding device comprising:

an intermediate section defining a first end and a second end and a through opening,
first and second integral flange sections extending from the first and second ends of said intermediate section, respectively, and being dimensioned and arranged to apply retention forces to substantially opposing surfaces of one of the first and second housing element to thereby retain said intermediate section in an orientation transverse to said substantially opposing surfaces, and
an arcuate spring clip section extending along the through opening, said spring clip section being free to flex and being dimensioned and arranged to provide is grounding contact with one of the interior and exterior surfaces when said first housing element is disposed within the opening of said second housing element.

12. The grounding device of claim 11, wherein said grounding device is fabricated from a material selected from the group consisting of electrically conductive metals and alloys thereof.

13. The grounding device of claim 12, wherein said grounding device is fabricated from an alloy of beryllium copper.

14. The grounding device of claim 11, wherein said first flange section has a substantially arcuate curvature having a radius of curvature dimensioned and arranged for mating engagement with a curved portion of a first of said substantially opposing surfaces.

15. The combination of claim 14, wherein said second flange section includes a resilient closure portion having a substantially L-shaped cross section dimensioned and arranged for mating engagement with a substantially planar portion of a second of said substantially opposing surfaces, and a terminal lip portion contiguous therewith, whereby said grounding device may be positioned on one of said first and second housing elements by placing the first flange section over the curved portion of the first substantially opposing surface, pivoting said grounding device such that the intermediate section is substantially aligned with a corresponding one of the interior and exterior surfaces, manipulating said terminal lip portion such that said closure portion is brought into tight fitting engagement with said substantially planar portion of the second substantially planar surface, and releasing said terminal lip portion.

16. The combination of claim 11, wherein at least one of said first and said second flange section includes a resilient closure portion having a substantially L-shaped cross section dimensioned and arranged for mating engagement with a substantially planar portion of a corresponding one of said substantially opposing surfaces, and a terminal lip portion contiguous therewith.

17. A method of establishing a grounding path between an exterior surface of a first housing element and an interior surface of a second housing element, comprising the steps of:

providing a grounding device having
- an intermediate section defining a first end and a second end and a through opening,
- first and second integral flange sections extending from the first and second ends of said intermediate section, and
- an arcuate spring clip section extending along the through opening, said spring clip section being free to flex and being dimensioned and arranged to provide grounding contact with one of the interior and exterior surfaces when said first housing element is disposed within an opening of said second housing element;

placing the first flange section over a surface proximate one of the interior and exterior surfaces, pivoting the grounding device such that the intermediate section is substantially aligned with said one of the interior and exterior surfaces, and manipulating a resilient portion of the second flange portion so as to bring the second flange portion into tight fitting engagement with a portion of the third surface; and positioning the first housing element within the in the second housing element such that said interior and exterior surfaces are in substantial alignment and such that said grounding device establishes grounding contact between said first housing element and said second housing element.

18. The method of claim 17, further including a step of covering the opening in the second housing element after said positioning step to thereby completely enclose said first housing element.

19. A modular electronics package for use with a housing defining an opening having a peripheral, electrically conductive interior surface, comprising a first housing dement positionable within the opening in the housing such that an electrically conductive exterior surface of the first housing element faces is aligned with the electrically conductive interior surface of the housing;

a printed circuit board electrically coupled to the first housing element, the printed circuit board having at least one electronic component disposed thereon adapted to operate only when the electrically conductive exterior surface of the first housing element is properly connected to ground; and at least one grounding device electrically coupled and secured to the first housing element, said grounding device having an intermediate section defining a first end and a second end and a through opening, first and second integral flange sections extending from the first and second ends of the intermediate section, the first and second integral flange sections being dimensioned and arranged to apply retention forces to substantially opposing surfaces of the first housing element, and an arcuate spring clip section extends along the through opening of the intermediate section, the spring clip section being free to flex and being dimensioned and arranged to provide grounding contact with the electrically conductive interior surface of a second housing element.

* * * * *

UNITED STATES PATENT AND TRADEMARK OFFICE
CERTIFICATE OF CORRECTION

PATENT NO. : 6,362,425 B1
DATED : March 26, 2002
INVENTOR(S) : Robert Chilton, III It is certified that error appears in the above-identified patent and that said Letters Patent is hereby corrected as shown below:

<u>Title page,</u>
Item [57], ABSTRACT,
Line 9, after "grounding", change "deice" to -- device --.

<u>Column 1,</u>
Line 6, before "invention", change "preset" to -- present --.
Line 22, before "are", delete -- en --.
Line 26, after "trunk/" change "ridger" to -- bridger --.

<u>Column 2,</u>
Line 17, after "conductive", insert -- surface --.

<u>Column 4,</u>
Line 6, change "Will" to -- will --.
Line 46, change "Is" to -- is --.

<u>Column 6,</u>
Line 4, change "by" to -- be --.

<u>Column 7,</u>
Line 17, change "$R_2$" to -- $R_1$ --
Line 21, change "$R_1$" to -- $R_2$ --.
Line 27, change "R3" to -- $R_3$ --.
Line 27, change "0.050' " to -- 0.050" --.
Line 35, change "R2" to -- $R_2$ --.

<u>Column 9,</u>
Line 20, before "and" (first occurrence), change "flax" to -- flex --.

<u>Column 10,</u>
Line 25, after "provide", delete "is".

UNITED STATES PATENT AND TRADEMARK OFFICE
CERTIFICATE OF CORRECTION

PATENT NO. : 6,362,425 B1
DATED : March 26, 2002
INVENTOR(S) : Robert Chilton, III It is certified that error appears in the above-identified patent and that said Letters Patent is hereby corrected as shown below:

Column 11,
Line 22, before "in", insert -- opening --.

Column 12,
Line 1, change "dement" to -- element --.
Line 27, after "section", change "extends" to -- extending --.

Signed and Sealed this

Twenty-fourth Day of September, 2002

Attest:

JAMES E. ROGAN
Attesting Officer   Director of the United States Patent and Trademark Office